(12) United States Patent
Robin et al.

(10) Patent No.: US 11,302,677 B2
(45) Date of Patent: Apr. 12, 2022

(54) PROCESS FOR MANUFACTURING AN LED-BASED EMISSIVE DISPLAY DEVICE

(71) Applicant: Commissariat à l'Énergie Atomique et aux Énergies Alternatives, Paris (FR)

(72) Inventors: Ivan-Christophe Robin, Grenoble (FR); Stéphane Caplet, Sassenage (FR); Umberto Rossini, Coublevie (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 237 days.

(21) Appl. No.: 16/643,488

(22) PCT Filed: Sep. 3, 2018

(86) PCT No.: PCT/FR2018/052152
§ 371 (c)(1),
(2) Date: Feb. 28, 2020

(87) PCT Pub. No.: WO2019/048767
PCT Pub. Date: Mar. 14, 2019

(65) Prior Publication Data
US 2020/0194408 A1      Jun. 18, 2020

(30) Foreign Application Priority Data

Sep. 5, 2017   (FR) ...................................... 1758189

(51) Int. Cl.
*H01L 25/075*   (2006.01)
*H01L 33/58*    (2010.01)
*H01L 33/62*    (2010.01)

(52) U.S. Cl.
CPC .......... *H01L 25/0753* (2013.01); *H01L 33/58* (2013.01); *H01L 33/62* (2013.01);
(Continued)

(58) Field of Classification Search
CPC ..... H01L 25/0753; H01L 33/58; H01L 33/62; H01L 2933/0016; H01L 2933/005; H01L 2933/0058; H01L 2933/0066
See application file for complete search history.

(56) References Cited

U.S. PATENT DOCUMENTS

2005/0212406 A1* 9/2005 Daniels .................... F21K 9/90
                                                 313/503
2007/0145393 A1   6/2007 Darbinian et al.
(Continued)

FOREIGN PATENT DOCUMENTS

DE   10 2013 102 967 A1   9/2014
EP        1 115 155 A2    7/2001
(Continued)

OTHER PUBLICATIONS

International Search Report and Written Opinion for International Application No. PCT/FR2018/052152, dated Nov. 26, 2018.
(Continued)

*Primary Examiner* — Victor A Mandala
(74) *Attorney, Agent, or Firm* — Wolf, Greenfield & Sacks, P.C.

(57) ABSTRACT

A method of manufacturing an LED display device, including the successive steps of: a) transferring, onto a planar surface of a support plate made of a transparent material having its other surface structured and defining a plurality of microlenses, a plurality of semiconductor chips, each including at least one LED; and b) forming a network of conductive interconnection tracks contacting the chips by their surface opposite to the support plate.

18 Claims, 5 Drawing Sheets

(52) U.S. Cl.
 CPC .............. *H01L 2933/005* (2013.01); *H01L 2933/0016* (2013.01); *H01L 2933/0058* (2013.01); *H01L 2933/0066* (2013.01)

(56) References Cited

U.S. PATENT DOCUMENTS

| | | | | |
|---|---|---|---|---|
| 2008/0303039 | A1* | 12/2008 | Craford | H01L 33/62 257/89 |
| 2012/0112220 | A1* | 5/2012 | West | H01L 33/486 257/98 |
| 2017/0133818 | A1 | 5/2017 | Cok | |
| 2017/0242160 | A1* | 8/2017 | Zhang | G02B 3/0012 |
| 2018/0196272 | A1* | 7/2018 | Chen | H04N 13/305 |
| 2019/0057957 | A1* | 2/2019 | Xie | H01L 25/0753 |

FOREIGN PATENT DOCUMENTS

| | | | | |
|---|---|---|---|---|
| JP | 2017219625 A | * | 12/2017 | ............. G03B 21/14 |
| KR | 19990035849 A | * | 5/1999 | ....... H01L 31/02325 |
| WO | WO 2014/030830 A1 | | 2/2014 | |

OTHER PUBLICATIONS

International Preliminary Report on Patentability for International Application No. PCT/FR2018/052152, dated Mar. 19, 2020.

* cited by examiner

PROCESS FOR MANUFACTURING AN LED-BASED EMISSIVE DISPLAY DEVICE

This application is a national stage filing under 35 U.S.C. § 371 of International Patent Application Serial No. PCT/FR2018/052152, filed Sep. 3, 2018, which claims priority to French patent application FR17/58189, filed Sep. 5, 2017. The entire contents of these applications are incorporated here by reference in their entirety.

BACKGROUND

The present application concerns the forming of an emissive image display device comprising light-emitting diodes (LEDs), for example, a screen for a television, a computer, a smart phone, a tablet, etc.

DISCUSSION OF THE RELATED ART

An image display device comprising a plurality of elementary electronic chips arranged in an array on a same support slab has already been provided in French patent application Nr. 1561421 (DD16594) filed on Nov. 26, 2015 by the applicant. In such a device, each chip comprises a stack of a LED and of a LED control circuit, and corresponds to a pixel of the device. The chips forms one piece with the support slab and are connected to elements of electric connection of the support slab for their control. In each chip, the LED is formed in a stack of inorganic semiconductor layers, also called LED stack, for example, layers of one or a plurality of type III-V semiconductor materials, or the control circuit is formed inside and on top of a silicon substrate. The control circuit is placed against a surface of the LED stack, the chip being in electrical and mechanical contact with the support slab by the surface of the control circuit opposite to the stack of inorganic semiconductor layers.

A display device of the same type, but where each elementary chip comprises a plurality of LEDs, the chip control circuit being capable of individually controlling the different LEDs of the chip, has further been provided in French patent application n° 1752953 (DD17709/B15698) filed on Apr. 5, 2017 by the applicant.

In particular, one of the applications targeted by French patent application n° 1752953 (DD17709/B15698) concerns a so-called multi-view image display device, that is, a device where each image to be displayed is divided into a plurality of macropixels, each macropixel comprising a plurality of pixels corresponding to different views of the scene which is desired to be displayed. As an example, the different pixels of a same macropixel corresponding to a same pixel position respectively in different images of a same scene, taken under different viewing angles. A multi-view display device may for example be used in applications where it is desired to give the user an impression of three-dimensional viewing.

In the multi-view display devices described in French patent application n° 1752953 (DD17709/B15698), each elementary chip corresponds to a macropixel of the device, comprising n pixels P1, P2, . . . Pn intended to respectively display a same pixel of n different images, for example corresponding to n different views of a same scene, where n is an integer greater than 1. Each pixel Pi of the macropixel, i being an integer in the range from 1 to n, may comprise a plurality of sub-pixels capable of emitting in different wavelength ranges, to allow the display of color images. Thus, each chip comprises n*m LEDs, where m is an integer greater than or equal to 1 designating the number of sub-pixels per pixel, for example, equal to three for RGB pixels.

In such a multi-view image display device, each elementary chip is further topped (on the side of the chip opposite to the support slab, that is, on the LED side), with a lens capable of achieving the angular separation of the beams corresponding to the different pixels of the macropixel, so that the user perceives different views of the scene when his/her eye displaces parallel to the display device.

The manufacturing of a multi-view display device is here more particularly considered.

SUMMARY

Thus, an embodiment provides a LED display device manufacturing method, comprising the successive steps of:

a) transferring, onto a planar surface of a support plate made of a transparent material having its other surface structured and defining a plurality of microlenses, a plurality of semiconductor chips, each comprising at least one LED; and b) forming a network of conductive interconnection tracks contacting the chips by their surface opposite to the support plate.

According to an embodiment, during step a), the support plate is illuminated by means of a light source arranged on the side of its structured surface, to generate on its planar surface a light pattern used as an alignment mark for the positioning of the chips on the support plate.

According to an embodiment, the method further comprises, between step a) and step b), a step c) of deposition of an opaque resin layer between the chips of the device.

According to an embodiment, the layer is a negative resist layer, step c) comprising the successive steps of:

depositing the layer between the chips and on the surface of the chips opposite to the support plate;

illuminating the layer through the support plate, the chips being used as a mask during the illumination step; and developing the resist.

According to an embodiment, step c) further comprises a step of annealing the layer between the illumination step and the development step.

According to an embodiment, each chip comprises a stack of inorganic semiconductor layers having the LED formed therein, and a LED control circuit formed inside and on top of a semiconductor substrate, the control circuit being placed against a surface of the stack, and each chip being arranged so that the surface of the stack opposite to the control circuit faces the support plate.

According to an embodiment, each chip comprises a plurality of LEDs formed in the stack, the control circuit being capable of individually controlling the different LEDs of the chip.

According to an embodiment, in each chip, the control circuit comprises a plurality of electric connection terminals arranged on the surface of the control circuit opposite to the stack.

According to an embodiment, the network of conductive interconnection tracks is in contact with the electric connection terminals.

According to an embodiment, the network of conductive interconnection tracks is formed by printing of a first conductive level, followed by an insulating level, followed by a second conductive level.

Another embodiment provides a LED display device, comprising:

a support plate made of a transparent material having a planar surface and having its other surface structured and defining a plurality of microlenses;

a plurality of semiconductor chips each comprising at least one LED, arranged on the planar surface of the support plate; and a network of interconnection conductive tracks contacting the chips by their surface opposite to the support plate.

According to an embodiment, each chip comprises a stack of inorganic semiconductor layers having the LED formed therein, and a LED control circuit formed inside and on top of a semiconductor substrate, the control circuit being placed against a surface of the stack, and each chip being arranged so that the surface of the stack opposite to the control circuit faces the support plate.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed. In particular, the forming of the elementary chips of the described display devices has not been detailed, the described embodiments being compatible with the usual way of forming such chips. As an example, the elementary chips may be manufactured according to methods identical or similar to those described in above-mentioned French patent applications n° 1561421 (DD16594) and n° 1752953 (DD17709/B15698). In the following description, when reference is made to terms qualifying relative positions, such as terms "above", "under", "upper", "lower", etc., or to terms qualifying directions, such as terms "horizontal", "vertical", etc., it is referred to the orientation of the cross-section views of the drawings, it being understood that, in practice, the described devices may be oriented differently. Unless otherwise specified, expressions "approximately", "substantially", and "in the order of" mean within 10%, preferably within 5%, or when they relate to angular dimensions or orientations, within 10 degrees, preferably within 5 degrees.

According to an aspect of an embodiment, a multi-view display device manufacturing method is provided where, rather than transferring the elementary chips corresponding to the macropixels of the device onto a support plate comprising electric connection elements, and then arranging microlenses above the macropixels, the elementary chips are directly transferred onto a transparent support plate integrating microlenses, after which electric connection elements contacting the chips by their surface opposite to the support plate are formed. In other words, the microlens plate is here used as a support for the elementary chips and for the electric connection elements of the display device, which enables to do away with a support slab specifically provided for this purpose. A particularly thin (possibly flexible) and inexpensive display device can thus be formed.

Figure 1A:
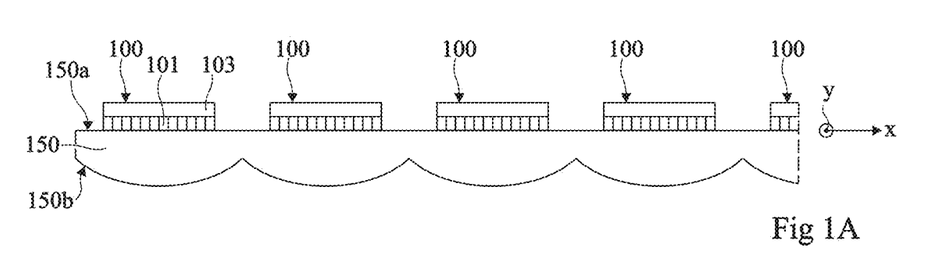
FIGS. 1A, 1B, and 1C are cross-section views schematically illustrating steps of an example of a method of manufacturing a multi-view emissive LED display device according to an embodiment.
Figure 1B:
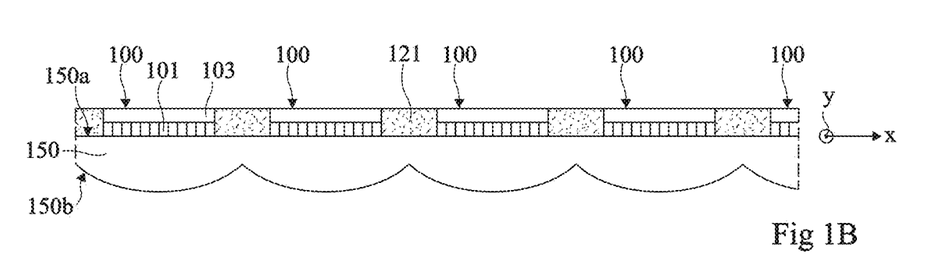
Figure 1C:
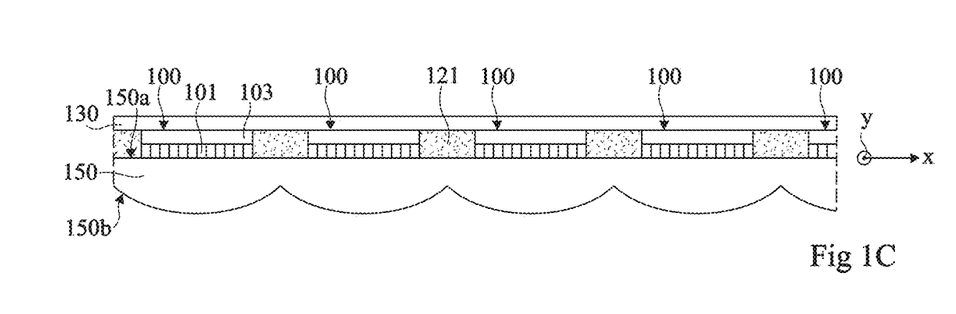

FIGS. 1A, 1B, and 1C are cross-section views schematically illustrating successive steps of an example of a method of manufacturing a multi-view emissive LED display device according to an embodiment.

FIG. 1A illustrates a step of transfer of the elementary chips 100 of the display device onto a support plate 150.

Each elementary chip 100 comprises a stack 101 of inorganic semiconductor layers, also called LED stack, for example, layers of one or a plurality of type III-V semiconductor materials, for example, gallium nitride layers. Each chip 100 comprises a plurality of LEDs (not detailed in FIGS. 1A to 1C) formed in stack 101, respectively corresponding to the different sub-pixels of the macropixel. Each chip 100 further comprises, placed against a surface of LED stack 101, a control circuit 103 formed inside and on top of a semiconductor substrate, for example, made of silicon. Control circuit 103 is electrically connected to LED stack 101, and is capable of individually controlling the different LEDs of LED stack 101. The surface of LED stack 101 opposite to control circuit 103 defines the light emission surface of the chip. The surface of control circuit 103 opposite to LED stack 101 defines the electric connection surface of the chip, and comprises a plurality of terminals (not detailed in FIGS. 1A to 1C) of connection of the chip to an external device.

Support plate 150 is a plate of a transparent material, for example, glass or plastic, having a substantially planar surface 150a (the upper surface in the shown example) and having a surface 150b (the lower surface in the shown example) opposite to surface 150a having structures, for example of convex shape, defining a plurality of microlenses.

Elementary chips 100 are transferred onto support plate 150, on the side of its planar surface 150a, so that the light emission surface of each chip 100 faces the support plate. A layer of clear glue (not detailed in the drawings) may be provided at the interface between the light emission surface of each chip 100 and the planar surface 150a of support plate 150, to bond the chips to the support plate.

At the step of FIG. 1A, elementary chips 100 should preferably be positioned according to a relatively accurate alignment relative to the optical axes of the microlenses formed in support plate 150. To achieve this alignment, it may be provided, during the step of transfer of chips 100 onto support plate 150, to illuminate plate 150 by means of a light source (not shown in the drawing) arranged on the side of its surface 150b, to generate on surface 150a of plate 150 a luminous pattern capable of being used as an alignment mark for the positioning of chips 100. As an example, the light source is a point source, for example, positioned opposite the center of support plate 150, at a distance from support plate 150 corresponding to the nominal viewing distance of the device. The light is then focused by the microlenses, generating on surface 150a of plate 150 a luminous pattern capable of being used as an alignment mark for the positioning of chips 100. More generally, any other known alignment method may be used during this step.

FIG. 1B illustrates an optional step of deposition of an opaque resin layer 121, for example, a black resin layer, between the elementary chips 100 of the display device, particularly to avoid parasitic reflections of light originating from the outside of the display device, on the conductive interconnection tracks which will be substantially arranged (step of FIG. 1C) on the side of chips 100 opposite to support plate 150. The provision of a black resin layer 121 particularly enables to increase the contrast when the display device is used with a non-zero ambient light.

As an example, layer 121 is a layer of negative resist. Layer 121 is for example deposited over the entire upper surface of the assembly obtained at the end of the step of FIG. 1A, that is, on the connection surface of chips 100, as well as on surface 150a of support plate 150 between chips 100. Layer 121 is then illuminated through microlenses, that is, by means of a radiation source arranged on the side of surface 150b of support plate 150, for example, an extensive diffuse source. Elementary chips 100 are used as a mask during the illumination step. In other words, the illumination step results in initiating the polymerization of the resin in the area of layer 121 located between the elementary chips 100 of the device (which are thus not masked by elementary chips 100), but not in the areas of layer 121 topping elementary chips 100 (and thus masked by elementary chips 100). After the illumination step, an anneal may be provided to increase the resin polymerization in the illuminated areas. A development step may then be provided to remove the resin from the areas where it has not been polymerized, while keeping it in the polymerized areas. In other words, layer 121 is kept between the elementary chips 100 of the device, but removed above the elementary chips to free the access to the connection surface of each chip.

FIG. 1C illustrates a step of forming a network 130 of conductive interconnection tracks on the upper surface of the device obtained at the end of the steps of FIGS. 1A and 1B, that is, on the side of chips 100 opposite to support plate 150. Interconnection network 130 connects the elementary chips 100 of the display device together and to an external control circuit (not shown). Interconnection network 130 comprises an alternation of conductive and insulating levels (not detailed in FIG. 1C), for example, at least two conductive levels separated by an insulating level, formed by a printing method of inkjet printing, silk-screening, rotogravure type, or by any other adapted method.

FIGS. 2, 3A to 3C, and 4 illustrate embodiments of the elementary chips 100 and of the interconnection network 130 of the display device.

Figure 2:
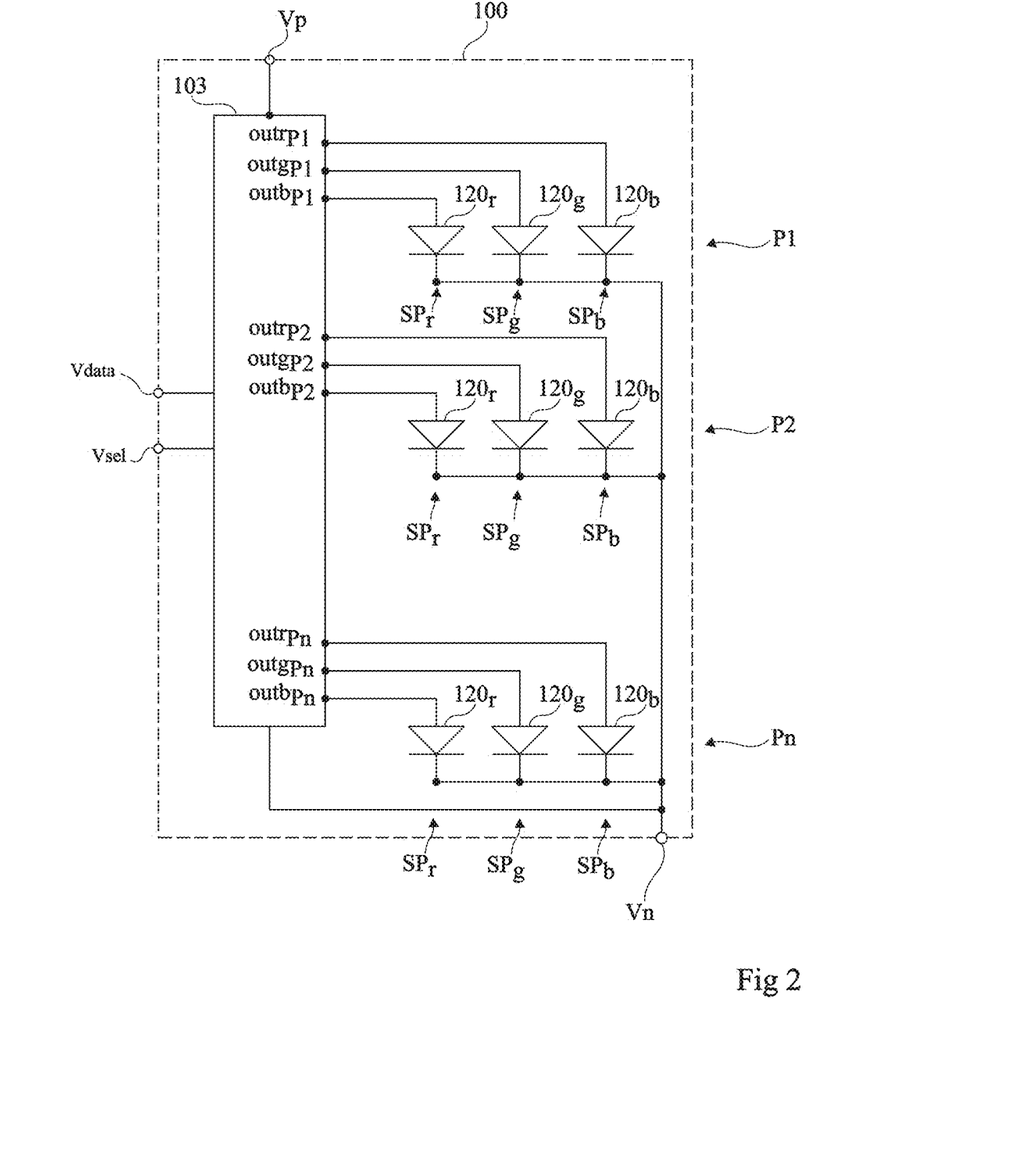
FIG. 2 is an electric diagram of the circuits of an example of an elementary chip of a multi-view emissive LED display device according to an embodiment.

FIG. 2 is a simplified electric diagram of the circuits of an example of an elementary chip 100 of a multi-view emissive LED display device according to an embodiment.

In this example, each elementary chip 100 corresponds to a macropixel of the device, comprising n pixel P1, P2, ... Pn, each pixel Pi comprising three sub-pixels $SP_r$, $SP_g$ and $SP_b$ capable of respectively emitting red light, green light, and blue light.

For each sub-pixel $SP_r$, $SP_g$, $SP_b$, chip 100 comprises a LED $120_r$, respectively $120_g$, respectively $120_b$, formed in the LED stack 101 of the chip. LEDs $120_r$, $120_g$, and $120_b$ are for example LEDs of different natures capable of emitting light in different wavelength ranges. As a variation, LEDs $120_r$, $120_g$, and $120_b$ are of same nature and emit in the same wavelength range, but are topped with filters or photoluminescent conversion elements of different natures so that pixels $SP_r$, $SP_g$, and $SP_b$ emit in different wavelength ranges.

Chip 100 further comprises a control circuit 103 capable of individually controlling the intensity of the light radiation emitted by each of the chip LEDs. In this example, control circuit 103 comprises four terminals of connection to the outside Vp, Vn, Vsel, and Vdata, arranged on the chip connection surface, that is, on the surface of control circuit 103 opposite to LED stack 101. For simplification, the electric signals applied to the connection terminals of the chips are designated with the same references as the actual terminals. Terminals Vp and Vn are intended to respectively receive a low power supply potential Vp (for example, the ground) and a high power supply potential (that is, greater than the low power supply potential) Vn of the chip. Terminals Vsel and Vdata are intended to receive chip control signals. More particularly, signal Vsel is a chip selection signal, and signal Vdata is a signal for setting the luminosity levels of the different LEDs of the chip.

In the present example, and as described in above-mentioned French patent application n° 1752953 (DD17709/B15698), during a phase of update of the n*m sub-pixels of the chip (m=3 in the present example), the n*m individual signals for setting the n*m LEDs of the chips are submitted to a time multiplexing on terminal Vdata. In other words, each chip 100 comprises a single terminal of connection to the outside to receive the n*m individual signals for setting the luminosity of the different LEDs of the chip. Thus, in the example of FIG. 2, each elementary chip 100 only comprises four terminals of connection to the outside, that is, no more than in an elementary chip of the type described in above-mentioned French patent application n° 1561421 (DD16594), comprising a single LED. This advantageously enables to limit the number and the density of the electric connection elements to be provided in the interconnection network 130 (FIG. 1C) coupling elementary chips 100 to an external control circuit.

Chip control circuit 103 is capable of demultiplexing the signals received on terminal Vdata and of applying to each LED of chip 100 a bias signal which is a function of the individual LED setting signal received on terminal Vdata. For this purpose, control circuit 103 comprises n*m output nodes respectively coupled to the anode contact regions of the n*m LEDs of the chip. More particularly, in this example, circuit 103 comprises, for each pixel Pi of the chip, an output node $outr_{Pi}$ coupled to the anode of LED $120_r$ of pixel Pi, an output node $outg_{Pi}$ coupled to the anode of LED $120_g$ of pixel Pi, and an output node $outb_{Pi}$ coupled to the anode of LED $120_b$ of pixel Pi. Circuit 103 is for example capable of supplying each LED of the chip, via its corresponding output node, with a bias current which is a function of the individual LED setting signal received on terminal Vdata of the chip. In the present example, each of the chip LEDs $120_r$, $120_g$, $120_b$ has its cathode connected to terminal Vn.

The setting signal Vdata received by chip 100 may be an analog signal or a serialized digital signal, the forming of the decoding (or demultiplexing) circuits of signal Vdata being accordingly adaptable. To ease the decoding of signal Vdata by control circuit 103, a synchronization signal or a clock signal may be applied to terminal Vsel of the chip. As a variation, the chip may comprise an additional specific connection terminal (not shown) to apply the clock or synchronization signal.

As an example, the elementary chips 100 of the display device are arranged in an array of rows and columns on support plate 150 (FIGS. 1A to 1C). The elementary chips 100 of the device are for example simultaneously controllable row by row. In other words, for each row of the array, the chips in the row have their control terminals Vsel connected to a same row control conductive track of interconnection network 130 (FIG. 1C), the chips of different rows having their control terminals Vsel connected to different conductive row control tracks of the interconnection network. Further, for each column of the array, the chips in the column have their control terminals Vdata connected to a same conductive column control track of the interconnection network, the chips of different columns having their control terminals Vdata connected to different conductive column control tracks of the interconnection network. During the display of an image, the macropixels of the device may thus be refreshed simultaneously row by row.

Figure 3A:
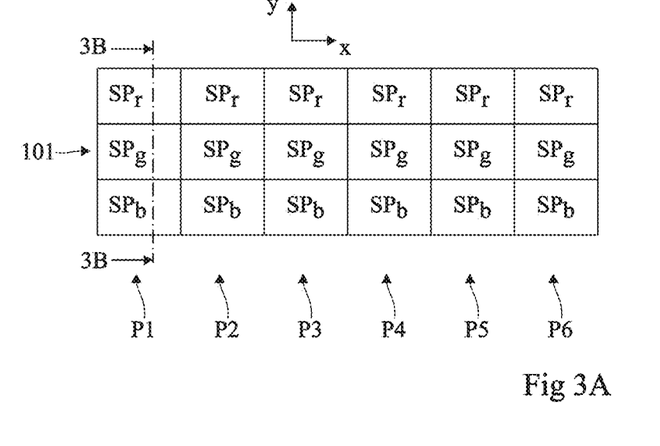
FIGS. 3A, 3B, and 3C are simplified respective top, cross-section, and bottom views of an example of an elementary chip of a multi-view emissive LED display device according to an embodiment.
Figure 3B:
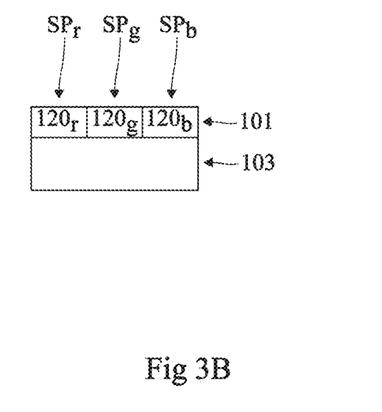
Figure 3C:
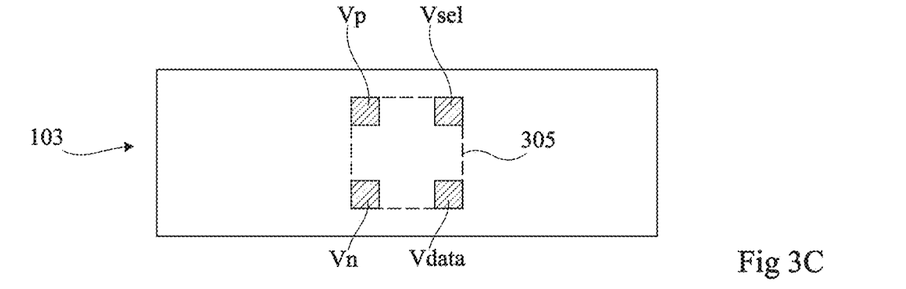

FIGS. 3A, 3B, and 3C are simplified views of an elementary chip 100 of an image display device of the above-described type. In this example, chip 100 comprises six pixels P1, P2, P3, P4, P5, and P6, each comprising three sub-pixels $SP_r$, $SP_g$, and $SP_b$ capable of emitting in three different wavelength ranges.

FIG. 3A is a top view (on the light emission surface side) of the chip, FIG. 3B is a cross-section view of the chip along plane 3B-3B of FIG. 3A, and FIG. 3C is a bottom view (on the connection surface side) of the chip.

As shown in FIG. 3C, the chip comprises, on the side of the surface of control circuit 103 opposite to LED stack 101, an electric connection area 305 comprising the four terminals of connection to the outside Vp, Vn, Vsel, and Vdata of the chip.

Figure 3D:
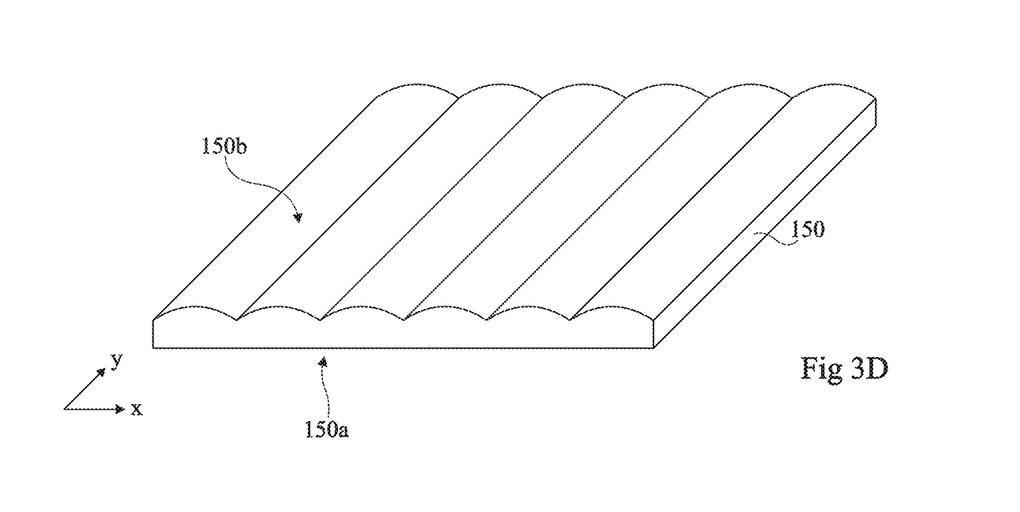
FIG. 3D is a perspective view schematically illustrating an embodiment of a support plate of a multi-view emissive LED display device according to an embodiment.

It should be noted that in the shown example, as can be seen in FIG. 3A, the pixels P1, P2, . . . Pn of the chip are arranged in a linear array, aligned along an axis x. The elementary chips are assembled on support plate 150 (FIGS. 1A to 1C) of the device according to an array layout in rows and columns, so that the axis x of each chip is substantially parallel to the array rows. In each pixel Pi, the sub-pixels $SP_r$, $SP_g$, $SP_b$ of the pixel are however arranged in a linear array, aligned along an axis y substantially orthogonal to axis x, and substantially parallel to the columns of the macropixel array. Indeed, in a multi-view display device, it is generally desired for the user to be able to perceive different views of the scene when the observer's eye displaces along a direction parallel to the axis of the array rows (generally a horizontal direction), and not when it displaces along a direction parallel to the axis of the columns (generally a vertical direction). In this example, the microlenses of support plate 150 are capable of forming an angular separation, along axis x, of the beams corresponding to the different pixels of the macropixel, without performing an angular separation along axis y. As an example, the microlenses have, in front view, the shape of strips substantially parallel to the array columns, each strip having a convex transverse cross-section (along axis x) and a substantially rectilinear longitudinal cross-section (along axis y), as schematically illustrated in the perspective view of the support plate 150 of FIG. 3D (also see the axes x and y shown in FIGS. 1A, 1B, 1C). An advantage of such a configuration is that it enables to avoid an angular separation of the different colors of a same pixel by the microlenses.

Figure 4:
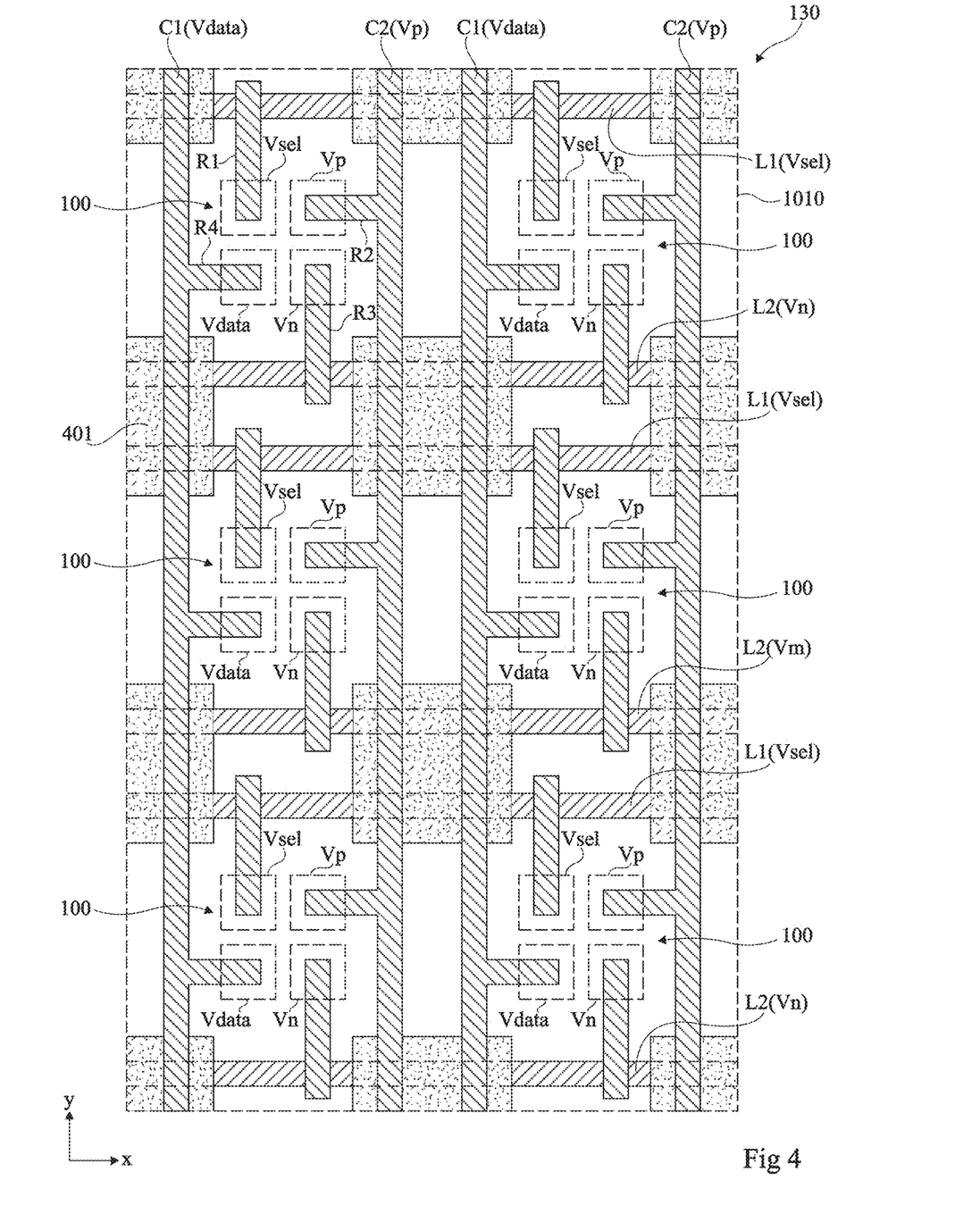
FIG. 4 is a partial simplified top view of an example of a multi-view emissive LED display device according to an embodiment.

FIG. 4 is a top view of an example of a multi-view emissive LED display device of the type described hereabove, more particularly illustrating an embodiment of the interconnection network 130 (FIG. 1C) of the display device.

In FIG. 4, only a portion of the display device, corresponding to a sub-array of three rows and two columns of the device (that is, 3*2=6 elementary chips, that is, 6 macropixels, that is, 6*n pixels and thus 6*n*m sub-pixels), has been shown. For more clarity, only interconnection network 130, as well as electric connection terminals Vp, Vn, Vsel, and Vdata of each elementary chip 100, has been detailed in FIG. 4. In particular, the contour of chips 100, opaque resin layer 121, and the support plate 150 of the device are not shown in FIG. 4.

Interconnection network 130 comprises electric connection elements, and in particular conductive tracks, formed on the upper surface of the assembly obtained at the end of the steps of FIGS. 1A and 1B. Such electric connection elements are formed by deposition of a succession of conductive and insulating levels on the upper surface of the assembly. The electric connection elements are for example formed by a printing method of inkjet printing, silk-screening, rotogravure type, or by any other adapted printing method.

Active circuits (not shown) for controlling the display device, capable of powering and controlling the elementary chips of the device via the electric connection elements of interconnection network 130, are for example connected to the electric connection elements of interconnection network 130 at the periphery of the display device.

In the shown example, the manufacturing of interconnection network 130 comprises the following successive printing steps.

During a first printing step, a plurality of conductive tracks substantially parallel to the direction of the rows of the display device are printed on the upper surface of the device obtained at the end of the steps of FIGS. 1A and 1B. More particularly, in the present example, during the first printing step, two conductive tracks L1 and L2 extending along substantially the entire length of the rows of the display device are printed for each row of the display device. Tracks L1 are intended to convey the control signals Vsel of the different macropixel rows of the device. Tracks L2 are intended to distribute the low power supply potential Vn of the device. The conductive elements printed during the first printing step define a first conductive level M1 of the interconnection network.

During a second printing step, certain portions of conductive tracks L1 and L2 are covered with an insulating material 401, to allow the subsequent printing of conductive tracks extending above tracks L1 and L2, without creating a short-circuit with tracks L1 and L2.

During a third printing step, a plurality of conductive tracks substantially parallel to the direction of the columns of the display device are printed on the upper surface of the assembly. More particularly, in the present example, during the third printing step, two conductive tracks C1 and C2 extending along substantially the entire height of the columns of the display device are printed for each column of the display device. Tracks C1 are intended to convey the signals Vdata for controlling the different pixel or macropixel columns of the device. Tracks C2 are intended to distribute the high power supply potential Vp of the device. Conductive tracks C1 and C2 are insulated from conductive tracks L1 and L2 by insulating regions 401 formed at the previous step. During the third printing step, for each elementary chip 100 of the device, four conductive track portions R1, R2, R3, and R4 respectively coupling terminal Vsel of the chip to the conductive track L1 of the row comprising the chip, terminal Vp of the chip to conductive track C2 of the column comprising the chip, terminal Vp of the chip to the conductive track L2 of the row comprising the chip, and terminal Vdata of the chip to the conductive track C1 of the column comprising the chip, are further printed.

As a variation, and according to the layout of the electric connection terminals Vsel, Vp, Vdata, and Vn of the elementary chips, conductive tracks C1 and C2 may directly run on top of and in contact with connection terminals Vdata and Vp respectively, in which case conductive track portions R2 and R4 may be omitted.

The tracks and conductive track portions printed during the third step define a second conductive level M2 of the interconnection network.

An advantage of the interconnection network 130 described in relation with FIG. 4 is that all the tracks or conductive track portions directly connected to the connection terminals of the elementary chips (elements R1, R2, R3, and R4 in the shown example) are formed in a same conductive level, during a same printing step, which allows a relatively accurate positioning of the connection elements with respect to one another. Indeed, the printing resolution of the conductive patterns during a same printing step is relatively high, while there may exist a relatively significant misalignment between conductive patterns formed during different printing steps. As an example, an interconnection network of the type described in relation with FIG. 4 is compatible with a minimum distance in the order of 20 µm between two contact terminals of a same elementary chip, which is quite satisfactory given the relatively large dimensions, typically several hundreds of micrometers, of the elementary chips.

Figure 5:
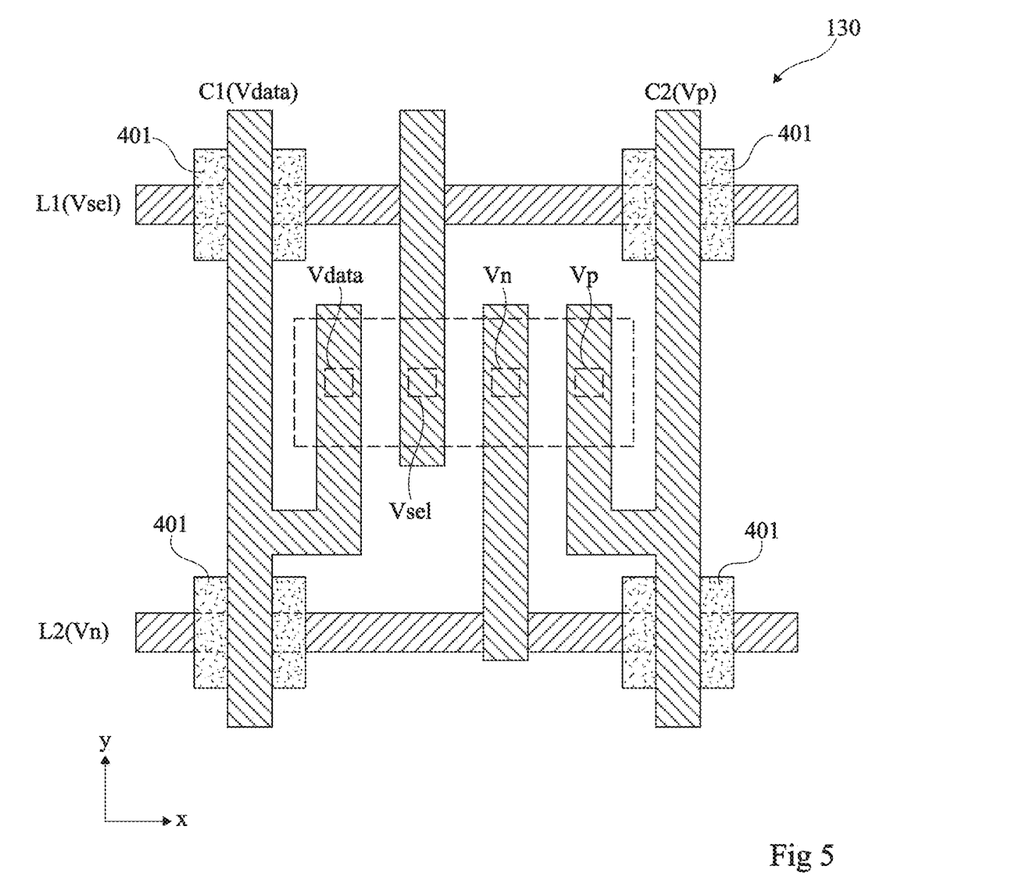
FIG. 5 is a partial simplified top view of an alternative embodiment of the device of FIG. 4.

FIG. 5 is a top view of an alternative embodiment of the device of FIG. 4.

In FIG. 5, only a portion of the display device, corresponding to a single macropixel of the device, has been shown. For more clarity, only interconnection network 130, as well as electric connection terminals Vp, Vn, Vsel, and Vdata of each elementary chip 100, has been detailed in FIG. 5.

The variation of FIG. 5 differs from the example of FIG. 4 mainly in that, in this variation, the contact terminals Vdata, Vsel, Vp, and Vn of each elementary chip are aligned, which enables, in the case of a roller printing technology, to benefit from the maximum resolution of the printing technique since, in the critical printing area (the contacting area), the printed conductive patterns are parallel lines oriented along the printing axis (axis y in the shown example).

Specific embodiments have been described. Various alterations and modifications will occur to those skilled in the art. In particular, although only embodiment where each elementary chip of the display device comprises four terminals of connection to the outside have been described, the method described in relation with FIGS. 1A to 1C may be adapted to the manufacturing of a display device where each elementary chip comprises a number of terminals of connection to the outside different from four.

Further, the described embodiments are not limited to the above-described examples where each pixel of a macropixel comprises a plurality of sub-pixels capable of emitting in different wavelength ranges. As a variation, the above-described examples may be adapted to the case where the pixels P1, P2, . . . Pn of each elementary chip 100 of the device are monochromatic pixels, for example, comprising a single LED.

Further, although only examples of application of the method of FIGS. 1A to 1C to the manufacturing of a multi-view display device have been described, the embodiments are not limited to this specific application.

More generally, the method of FIGS. 1A to 1C may be adapted to the forming of any emissive LED display device where microlenses are desired to be arranged opposite the elementary chips of the device.

As an example, each elementary chip of the display device may correspond to a single pixel, for example, a monochromatic pixel (the chip then comprising a single LED) or a color pixel (the chip then comprising a plurality of sub-pixels, each comprising a LED). In this case, the microlenses of support plate 150 for example have the function of increasing the directionality of the display device, and no longer of ensuring an angular separation of the different beams emitted by each chip.

It should further be noted that in the examples of FIGS. 4 and 5, the row/column layout of the connections to terminals Vsel, Vn, Vp, and Vdata of the elementary chips may be different from what has been shown.

The invention claimed is:

1. A method of manufacturing a LED display device, comprising the successive steps of:
   a) transferring, onto a planar surface of a support plate made of a transparent material having its other surface structured and defining a plurality of microlenses, a plurality of semiconductor chips, each comprising at least one LED; and
   b) forming a network of conductive interconnection tracks contacting the chips by their surface opposite to the support plate.

2. The method according to claim 1, wherein during step a), the support plate is illuminated by means of a light source arranged on the side of its structured surface, to generate on its planar surface a light pattern used as an alignment mark for the positioning of the chips on the support plate.

3. The method according to claim 2, further comprising, between step a) and step b), a step c) of deposition of an opaque resin layer between the chips of the device.

4. The method according to claim 2, wherein each chip comprises a stack of inorganic semiconductor layers having said at least one LED formed therein, and a circuit for controlling said at least one LED formed inside and on top of a semiconductor substrate, the control circuit being placed against a surface of the stack, and said chip being arranged so that the surface of the stack opposite to the control circuit faces the support plate.

5. The method according to claim 1, further comprising, between step a) and step b), a step c) of deposition of an opaque resin layer between the chips of the device.

6. The method according to claim 5, wherein said layer is a negative resist layer, step c) comprising the successive steps of:
   depositing said layer between the chips and on the surface of the chips opposite to the support plate;
   illuminating said layer through the support plate, the chips being used as a mask during the illumination step; and
   developing the resist.

7. The method according to claim 6, wherein each chip comprises a stack of inorganic semiconductor layers having said at least one LED formed therein, and a circuit for controlling said at least one LED formed inside and on top of a semiconductor substrate, the control circuit being placed against a surface of the stack, and said chip being arranged so that the surface of the stack opposite to the control circuit faces the support plate.

8. The method according to claim 6, wherein step c) further comprises a step of annealing said layer between the illumination step and the development step.

9. The method according to claim 8, wherein each chip comprises a stack of inorganic semiconductor layers having said at least one LED formed therein, and a circuit for controlling said at least one LED formed inside and on top of a semiconductor substrate, the control circuit being placed against a surface of the stack, and said chip being arranged so that the surface of the stack opposite to the control circuit faces the support plate.

10. The method according to claim 5, wherein each chip comprises a stack of inorganic semiconductor layers having said at least one LED formed therein, and a circuit for controlling said at least one LED formed inside and on top of a semiconductor substrate, the control circuit being placed against a surface of the stack, and said chip being arranged so that the surface of the stack opposite to the control circuit faces the support plate.

11. The method according to claim 1, wherein each chip comprises a stack of inorganic semiconductor layers having said at least one LED formed therein, and a circuit for controlling said at least one LED formed inside and on top of a semiconductor substrate, the control circuit being placed against a surface of the stack, and said chip being arranged so that the surface of the stack opposite to the control circuit faces the support plate.

12. The method according to claim 11, wherein, in each chip, the control circuit comprises a plurality of electric connection terminals arranged on the surface of the control circuit opposite to the stack.

13. The method according to claim 11, wherein each chip comprises a plurality of LEDs formed in said stack, the control circuit being capable of individually controlling the different LEDs of the chip.

14. The method according to claim 13, wherein, in each chip, the control circuit comprises a plurality of electric connection terminals arranged on the surface of the control circuit opposite to the stack.

15. The method according to claim 12, wherein the network of conductive interconnection tracks is in contact with said electric connection terminals.

16. The method according to claim 15, wherein the network of conductive interconnection tracks is formed by printing of a first conductive level, followed by an insulating level, followed by a second conductive level.

17. A LED display device, comprising:
 a support plate made of a transparent material having a planar surface and having its other surface structured and defining a plurality of microlenses;
 a plurality of semiconductor chips, each comprising at least one LED, arranged on the planar surface of the support plate; and
 a network of conductive interconnection tracks contacting the chips by their surface opposite to the support plate.

18. The device according to claim 17, wherein each chip comprises a stack of inorganic semiconductor layers having said at least one LED formed therein, and a circuit for controlling said at least one LED formed inside and on top of a semiconductor substrate, the control circuit being placed against a surface of the stack and said chip being arranged so that the surface of the stack opposite to the control circuit faces the support plate.

* * * * *